United States Patent
Marino et al.

(10) Patent No.: US 10,664,398 B2
(45) Date of Patent: May 26, 2020

(54) LINK-LEVEL CYCLIC REDUNDANCY CHECK REPLAY FOR NON-BLOCKING COHERENCE FLOW

(71) Applicant: International Business Machines Corporation, Armonk, NY (US)

(72) Inventors: Charles F. Marino, Round Rock, TX (US); William J. Starke, Round Rock, TX (US); David J. Krolak, Rochester, MN (US); Paul A. Ganfield, Rochester, MN (US); Jeffrey A. Stuecheli, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/051,180

(22) Filed: Jul. 31, 2018

(65) Prior Publication Data
US 2020/0042449 A1 Feb. 6, 2020

(51) Int. Cl.
*G06F 12/08* (2016.01)
*G06F 12/0831* (2016.01)
*G06F 11/10* (2006.01)
*H03M 13/09* (2006.01)
*G06F 12/0817* (2016.01)

(52) U.S. Cl.
CPC ...... *G06F 12/0831* (2013.01); *G06F 11/1004* (2013.01); *G06F 12/0822* (2013.01); *H03M 13/09* (2013.01)

(58) Field of Classification Search
CPC ............ G06F 12/0831; G06F 12/0822; G06F 11/1004

USPC ......................................................... 711/141
See application file for complete search history.

(56) References Cited

U.S. PATENT DOCUMENTS

| | | |
|---|---|---|
| 2009/0271532 A1 | 10/2009 | Allison et al. |
| 2010/0005366 A1 | 1/2010 | Dell et al. |
| 2012/0177063 A1 | 7/2012 | Kim et al. |
| 2013/0061118 A1 | 3/2013 | Pi et al. |
| 2014/0108878 A1* | 4/2014 | Liu ........................... H04L 1/16 714/748 |

(Continued)

FOREIGN PATENT DOCUMENTS

| | | |
|---|---|---|
| WO | 2008146271 A1 | 12/2008 |
| WO | 2011036065 A1 | 3/2011 |
| WO | 2011078603 A2 | 6/2011 |

OTHER PUBLICATIONS

Sheinwald, D., et al., "Internet protocol small computer system interface (iSCSI) cyclic redundancy check (CRC)/checksum considerations", No. RFC 3385. 2002.

*Primary Examiner* — Hua J Song
(74) *Attorney, Agent, or Firm* — Garg Law Firm, PLLC; Rakesh Garg; Bryan Bortnick

(57) ABSTRACT

Data processing in a data processing system including a plurality of processing nodes coupled to an interconnect includes receiving, by a fabric controller, a first command from a remote processing node via the interconnect. The fabric controller determines that the command includes a replay indication, the replay indication indicative of a replay event at one or more processing nodes of the plurality of processing nodes. The first command is dropped from a deskew buffer of the fabric controller responsive to the determining that the command includes the replay indication.

20 Claims, 8 Drawing Sheets

(56) References Cited

U.S. PATENT DOCUMENTS

2015/0085667 A1* 3/2015 Sivanesan ............ H04W 76/38
370/237
2016/0329999 A1 11/2016 Li et al.

* cited by examiner

LINK-LEVEL CYCLIC REDUNDANCY CHECK REPLAY FOR NON-BLOCKING COHERENCE FLOW

TECHNICAL FIELD

The present invention relates generally to a method, system, and computer program product for communication in a multiprocessor data processing system. More particularly, the present invention relates to a method, system, and computer program product for link-level cyclic redundancy check (CRC) replay for non-block coherence flow in a multiprocessor data processing system.

BACKGROUND

Memory coherence is a condition in which corresponding memory locations for each processing element in a multiple processor system contain the same cached data. A memory coherence protocol is used to notify all of the processing elements of changes to shared memory values to enable that all copies of the data remain consistent. Memory coherence in symmetric multiprocessing (SMP) systems can be maintained either by a directory-based coherency protocol in which coherence is resolved by reference to one or more memory directories or by a snooping-based coherency protocol in which coherence is resolved by message passing between caching agents. As SMP systems scale to ever-larger n-way systems, snooping coherency protocols become subject to at least two design constraints, namely, a limitation on the depth of queuing structures within the caching agents utilized to track requests and associated coherence messages and a limitation in the communication bandwidth available for message passing.

To address the limitation on the depth of queuing structures within the caching agents, some designs have adopted non-blocking snooping protocols that do not require caching agents to implement message tracking mechanisms, such as message queues. Instead, in non-blocking snooping protocols, caching agents' requests are temporally bounded (meaning snoopers will respond within a fixed time) and are source throttled (to ensure a fair division of available communication bandwidth). For example, the total system bandwidth can be divided evenly (e.g., via time-division multiplexing) amongst all possible processing nodes in the system to ensure the coherency buses have sufficient bandwidth in a worst-case scenario when all processing nodes are issuing requests. However, equal allocation of coherency bus bandwidth in this manner limits the coherency bandwidth available to any particular processing nodes to no more than a predetermined subset of the overall available coherency bandwidth. Furthermore, coherency bandwidth of the system can be under-utilized when only a few processing nodes require high bandwidth.

SUMMARY

The illustrative embodiments provide a method, system, and computer program product. An embodiment of a method data processing in a data processing system including a plurality of processing nodes coupled to an interconnect includes receiving, by a fabric controller, a first command from a remote processing node via the interconnect. The embodiment further includes determining, by the fabric controller, that the command includes a replay indication, the replay indication indicative of a replay event at one or more processing nodes of the plurality of processing nodes. The embodiment further includes dropping the first command from a deskew buffer of the fabric controller responsive to the determining that the command includes the replay indication.

Another embodiment further includes storing a partial response associated with the command in an overcommit queue of the fabric controller. In another embodiment, the partial response includes an indication that the command was dropped. Another embodiment further includes sending the partial response to the remote processing node via the interconnect.

In another embodiment, the command is formatted as a link layer packet, the replay indication being in a first field of the link layer packet. In another embodiment, the first field is a one-bit field, a value of the one-bit field indicative of the replay indication. In another embodiment, the link layer packet further includes a second field, the second field including a command data payload. In another embodiment, the link layer packet further includes a second field including a cyclic redundancy check value associated with the link layer packet. In another embodiment, the data processing system includes a symmetric multiprocessor system.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

Certain novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
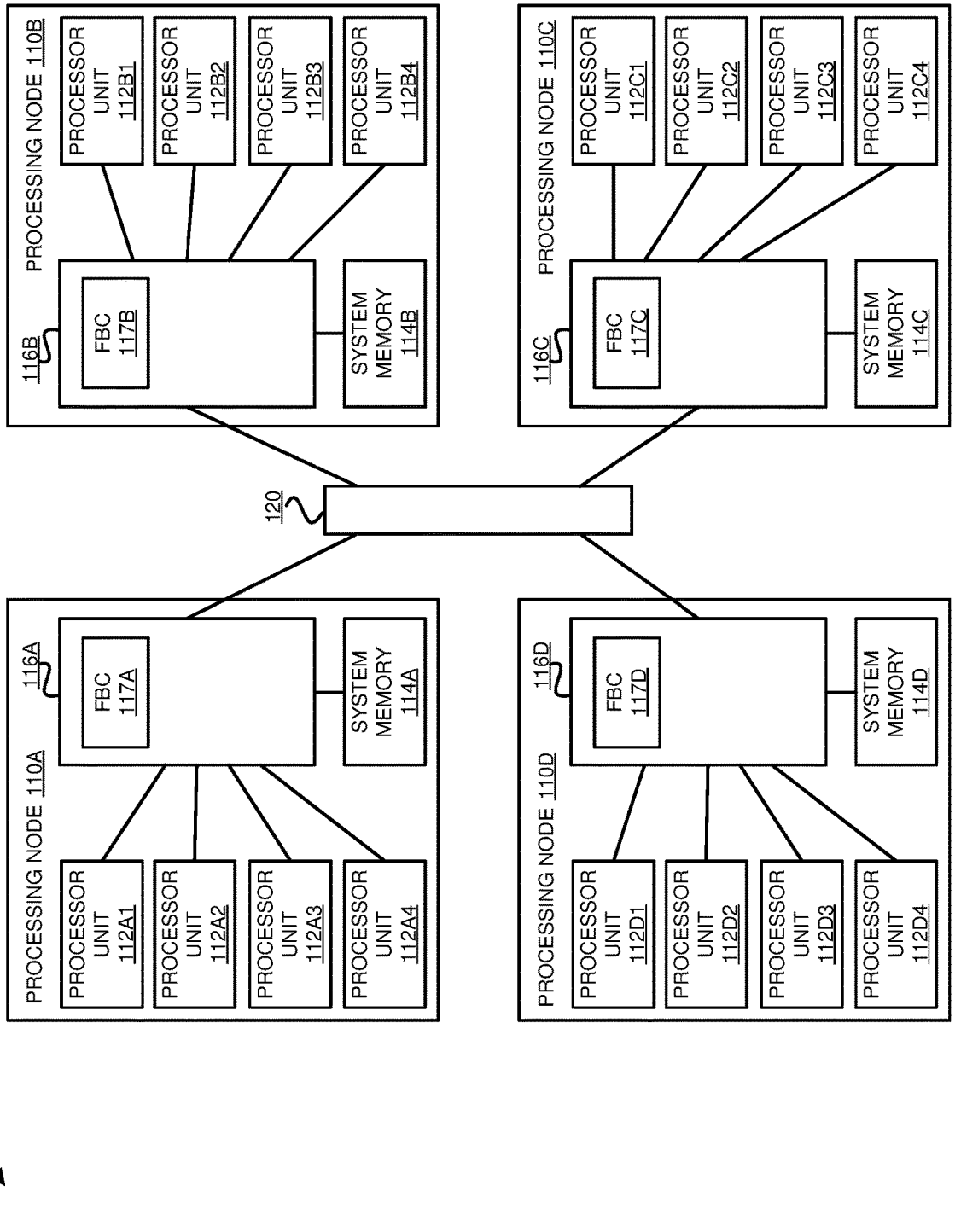
FIG. 1 depicts a block diagram of an exemplary data processing system in accordance with one or more embodiments.

The illustrative embodiments described herein are directed to link-level cyclic redundancy check (CRC) replay for non-block coherence flow in a multiprocessor data processing system. Processors of multiprocessor systems that implement a non-blocking snooping protocol to provide for memory coherence enable larger n-way SMP systems. SMP systems are typically limited by message queuing depth and limitations in coherency bandwidth in messages passing snooping-based coherency protocols. In non-blocking snooping protocols, caching agent requests are temporarily bounded such that when a request is broadcast, the request has a guaranteed fixed time in which all snoopers respond. Once a request is placed on the coherency network there is no queuing. This facilitates running the coherency network at very high utilizations. Therefore, increasing the overall network bandwidth has a direct effect on the system capacity to do work.

One critical factor in coherency network bandwidth is the external SMP interconnect. Running the external SMP interconnect buses at a higher frequency can increase system coherency bandwidth or reduce cost by keeping cross sectional bandwidth constant while reducing the number of pins and cables. To enable higher frequencies and increase bandwidth per signal, a cyclic redundancy check (CRC) based error detection protocol is utilized. When an error is detected by the CRC protocol, the packets are re-transmitted or replayed.

One or more embodiments described herein are direct to handling a replayed non-blocking request while still guaranteeing a fixed time coherency broadcast by leveraging the ability of the coherency protocol to retry requests due to temporary resource limitations in the system. An example of a temporary limitation is a replay event on an external SMP interconnect bus in which a request is unable to be transmitted by a sending chip.

In one or more embodiments, an interconnect bus can be over-utilized, some commands can be dropped, and a partial response (e.g., a response of a reflected command that indicates a drop: "rty_dropped_rcmd") can be returned for that processing node or a group of processing nodes. In one example, if a master processing node has exceeded a programmable threshold of retries then a mechanism and/or system can back-off command rates to allow one or more master processing nodes to make forward progress. In another example, when a first processing node has insufficient bandwidth to broadcast a command that the first processing node has received from a second processing node, the first processing node can return a retry partial response (e.g., a "rty_dropped_rcmd"). This response can indicate that the command was not broadcast to the first processing node or a group of processing nodes. In an embodiment, a processor non-blocking snooping protocol defines certain conditions in which a snooping agent can respond with a retry response. In the embodiment, any request subject to a CRC replay event is marked with a special response of rty_dropped_rcmd when the receiving packet was subject to a reply event. This response is formatted as a partial response and indicates that the command was not broadcast on the chip or group (e.g. a remote hub). In one or more embodiments, the partial response is combined with partial responses of one or more other chips.

The rty_dropped_rcmd response does not necessarily indicate the operation has failed. An operation can still succeed even though it is not broadcast on all chips in the system. In many cases, as long as the participating parties are able to snoop the command, the operation can succeed.

In one or more embodiments, a partial response can be combined with partial responses of other processing nodes, and the presence of a rty_dropped_rcmd may not necessarily cause a command to fail. For example, the command can still succeed even though it is not broadcast on all processing nodes in a system. For instance, as long as all required participating parties (e.g., HPC (highest point of coherency) and/or LPC (lowest point of coherency), etc.) are able to snoop and provide a non-retry partial response to a command, the operation can succeed.

An LPC is defined herein as a memory device or I/O device that serves as the repository for a memory block. In the absence of the existence of an HPC for the memory block, the LPC holds the true image of the memory block and has authority to grant or deny requests to generate an additional cached copy of the memory block. In one or more embodiments, the LPC will be the memory controller for the system memory holding the referenced memory block. An HPC is defined herein as a uniquely identified device that caches a true image of the memory block (which may or may not be consistent with the corresponding memory block at the LPC) and has the authority to grant or deny a request to modify the memory block, according to one or more embodiments. Descriptively, the HPC may also provide a copy of the memory block to a requestor in response to a command, for instance.

In one or more embodiments, a chip transmits requests to other chips in the SMP system depending upon a scope indicated within the request. In particular embodiments, the scopes include one of a local node scope indicating the local chip, a near node scope indicating the local chip and a targeted near chip, a group scope indicating the local chip and all near chips, a remote node scope indicating the local chip and a targeted remote chip, or a vectored group scope indicating a local group and one or more remote groups.

In the embodiment, all requests that are transmitted off chip pass through several protocol layers represented by an external SMP interconnect including a physical layer, a data link layer, and a transaction layer. In the embodiment, the data link layer forms a 240 bit packet protected by a CRC generated on the transmit side and checked on the receive side. In the embodiment, the data link layer marks any replays on a packet by setting a REPLAY bit in the packet. In the embodiment, the transaction layer uses the REPLAY indication to mark the request (e.g., the reflected command) as dropped in an external SMP interconnect scope encoding.

In the embodiment, the transaction layer forwards the request without the dropped indication. Requests from remote chips enter a link deskew buffer of a fabric controller and the fabric controller immediately drops requests with the dropped indication. In the embodiment, the fabric controller may drop requests in the link deskew buffer without the dropped indication either due to capacity (e.g., all entries are full) or due to expiration of the request. These types of dropped indications are referred to as Overcommit drops. In the embodiment, the fabric controller includes an expiration counter used to measure how long a command has been pending and to bound the maximum latency of commands in queue.

When a command is dropped from the link deskew buffer, the fabric controller provides an indication to a response transport logic, and the response transport tags a rty_dropped_rcmd response for the particular command in an overcommit queue. As partial responses are collected by the response transport logic, the rty_dropped_rcmd is factored into the final combined response. Success of the operation is possible in the presence of the rty_dropped_rcmd response if a HPC and/or LPC is found, i.e., broadcast on the chip(s) containing the HPC/LPC.

In one or more embodiments, the response transport logic allows off-chip links to support a command overcommit feature in which commands may be sent speculatively assuming there is enough available command bandwidth at the receiving chip to accept the commands. If there is not enough command bandwidth available, the speculative commands age out and are cancelled. In one or more embodiments, a link input command arbitrator sends a cancel indicator, along with a 5-bit slot indicator that corresponds to a partial response (pResp) FIFO entry. The rty_dropped_rcmd presp bit is set in the Presp FIFO and the Presp FIFO remembers which links had overcommit, and will not broadcast a complete response (Cresp) to those links. Since commands are allowed to be overcommitted, Cresp is broadcast to all chips that have snooped the original command In one or more embodiments, the Cresp broadcast uses flow control to prevents link and Cresp structure overruns.

During a replay event, the link layer asserts stop commands ("Stop_Cmds") which instruct the fabric controller to discontinue request broadcasts to the external SMP interconnect. In one or more embodiments, the link layer asserts the Stop_Cmds during a period in which packets are retransmitted. In one or more embodiments, once the replay is complete the link layer deasserts the Stop_Cmds.

An embodiment can be implemented as a software application. The application implementing an embodiment can be configured as a modification of an existing collaborative messaging system or platform, as a separate application that operates in conjunction with an existing collaborative messaging system or platform, a standalone application, or some combination thereof.

The illustrative embodiments are described with respect to certain types of multiprocessor systems and platforms, link-level cyclic redundancy check (CRC) replay procedures and algorithms, services, devices, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

In one or more embodiments, systems, methods, and/or processes described herein can provide and/or implement a fabric controller (FBC) that can be utilized with a scalable cache-coherent multiprocessor system. For example, the FBC can provide coherent and non-coherent memory access, input/output (I/O) operations, interrupt communication, and/or system controller communication, among others. For instance, the FBC can provide interfaces, buffering, and sequencing of command and data operations within one or more of a storage system and a storage subsystem, among others.

In one or more embodiments, a FBC link can be or include a split transaction, multiplexed command and data bus that can provide support for multiple processing nodes (e.g., a hardware implementation of a number of multiprocessor units). For example, a FBC link can provide support for multiple processor units.

In one or more embodiments, cache coherence can be maintained and/or achieved by utilizing a non-blocking snoop-based coherence protocol. For example, an initiating processing node (e.g., a hardware implementation of a multiprocessor unit) can broadcast commands to snoopers, snoopers can return coherence responses (e.g., in-order) to the initiating processing node, and a combined snoop response can be broadcast back to the snoopers. In one or more embodiments, multiple levels (e.g., scopes) of snoop filtering (e.g., Node, Group, RemoteGroup, System, etc.) can be supported to take advantage of locality of data and/or processing threads. For example, this approach can reduce a required amount of interlink bandwidth, can reduce bandwidth needed for system wide command broadcasts, and/or can maintain hardware enforced coherency using a snoop-based coherence protocol.

In one or more embodiments, a so-called "NodeScope" is a transaction limited in scope to snoopers within a single integrated circuit chip (e.g., a single processor unit or processing node), and a so-called "GroupScope" is a transaction limited in scope to a command broadcast scope to snoopers found on a physical group of processing nodes. If a transaction cannot be completed coherently using a more limited broadcast scope (e.g., a Node or Group), the snoop-based coherence protocol can compel a command to be reissued to additional processing nodes of the system (e.g., a Group or a System that includes all processing nodes of the system).

Referring now to FIG. 1, this figure depicts a block diagram of an exemplary data processing system 100 in accordance with one or more embodiments. As shown, data processing system 100 includes processing nodes 110A-110D that can be utilized in processing data and/or instructions. In one or more embodiments, data processing system 100 can be or include a cache coherent symmetric multiprocessor (SMP) data processing system. As illustrated, processing nodes 110A-110D are coupled to a system interconnect 120 (e.g., an interconnect fabric) that can be utilized in conveying address, data, and control information. System interconnect 120 can be implemented, for example, as a bused interconnect, a switched interconnect and/or a hybrid interconnect, among others.

In one or more embodiments, each of processing nodes 110A-110D can be realized as a multi-chip module (MCM) including multiple processor units 112, in which each of processor units 112A1-112D4 can be realized as an integrated circuit chip. As shown, processing node 110A can include processor units 112A1-112A4 and a system memory 114A; processing node 110B can include processor units 112B1-112B4 and a system memory 114B; processing node 110C can include processor units 112C1-112C4 and a system memory 114C; and processing node 110D can include processor units 112D1-112D4 and system memory 114D. In one or more embodiments, system memories 114A-114D include shared system memories and can generally be read from and written to by any processor unit 112 of data processing system 100.

As illustrated, each of processing nodes 110A-110D can include respective interconnects 116A-116D that can be communicatively coupled directly or indirectly to interconnect 120. As shown, processor units 112A1-112A4 and system memory 114A can be coupled to interconnect 116A (e.g., an interconnect fabric), processor units 112B1-112B4 and system memory 114B can be coupled to interconnect 116B (e.g., an interconnect fabric), processor units 112C1-112C4 and system memory 114C can be coupled to interconnect 116C (e.g., an interconnect fabric), and processor units 112D1-112D4 and system memory 114D can be coupled to interconnect 116D (e.g., an interconnect fabric).

In one or more embodiments, processor units 112A1-112D4, included in respective processing nodes 110, can be coupled for communication to each other. In one example, processor units 112A1-112A4, can communicate with other processor units via interconnect 116A and/or interconnect 120. In a second example, processor units 112B1-112B4, can communicate with other processor units via interconnect 116B and/or interconnect 120. In a third example, processor units 112C1-112C4, can communicate with other processor units via interconnect 116C and/or interconnect 120. In another example, processor units 112D1-112D4, can communicate with other processor units via interconnect 116D and/or interconnect 120.

In one or more embodiments, an interconnect (e.g., interconnects 116A, 116B, 116C, 116D, 120, etc.) can include a network topology where nodes can be coupled to one another via network switches, crossbar switches, etc. For example, an interconnect can determine a physical broadcast, where processing nodes snoop a command in accordance with a coherency scope, provided by a processor unit.

In one or more embodiments, data processing system 100 can include additional components, that are not illustrated, such as interconnect bridges, non-volatile storage, ports for connection to networks, attached devices, etc. For instance, such additional components are not necessary for an understanding of embodiments described herein, they are not illustrated in FIG. 1 or discussed further. It should also be understood, however, that the enhancements provided by this disclosure are applicable to cache coherent data processing systems of diverse architectures and are in no way limited to the generalized data processing system architecture illustrated in FIG. 1.

Figure 2:
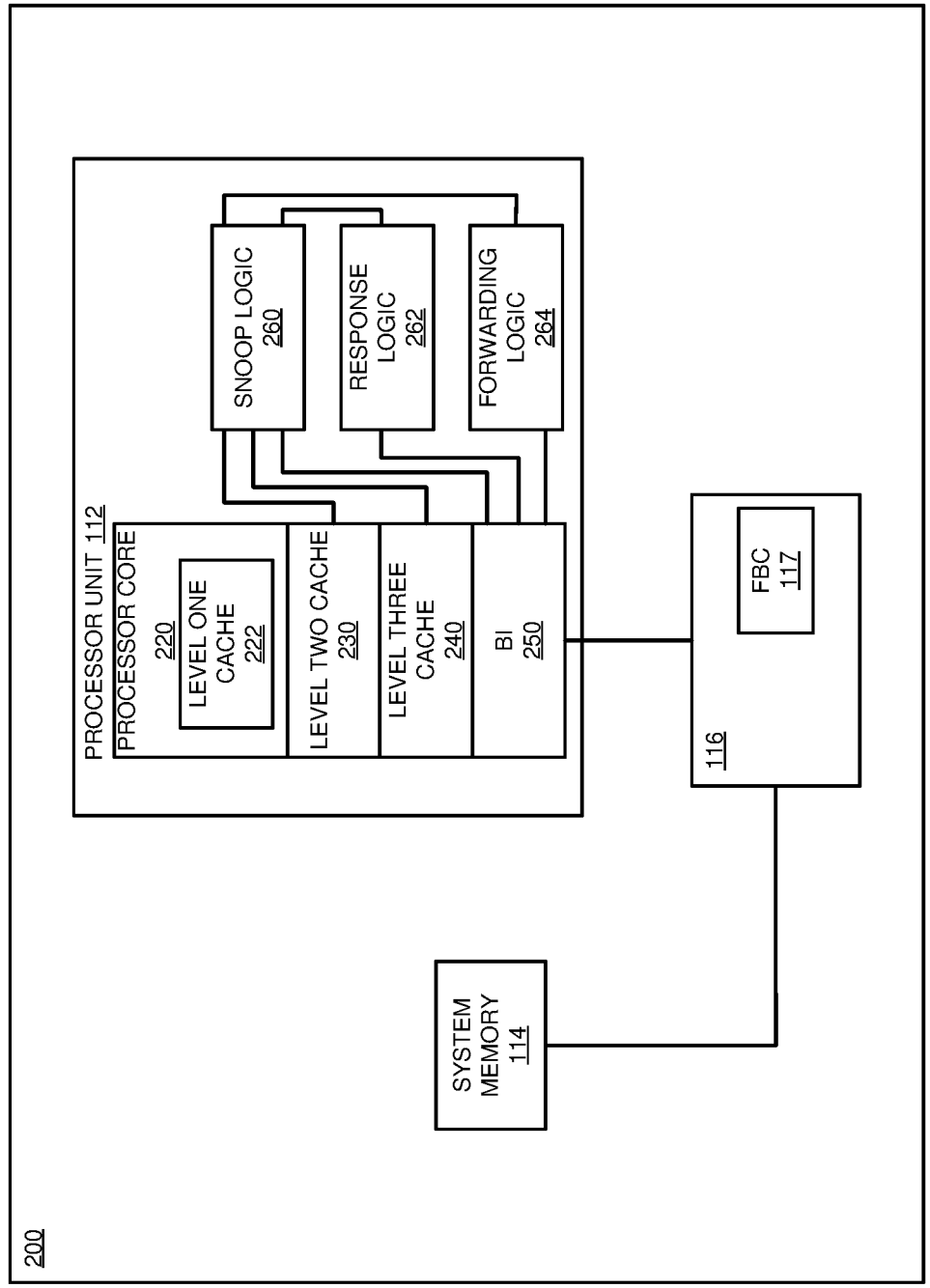
FIG. 2 depicts a block diagram of an exemplary processor unit in accordance with an illustrative embodiment.

Referring now to FIG. 2, this figure depicts a block diagram of an exemplary processor unit 112 in accordance with an illustrative embodiment. As shown, processor unit 112 can include one or more processor cores 220 that execute instructions of a selected instruction set architecture (ISA). In one or more embodiments, operation of processor core 220 can be supported by a multi-level volatile memory hierarchy having at its lowest level shared system memory 114, and at its upper levels, two or more levels of cache memory that can cache data and/or instructions residing within cacheable addresses. In one or more embodiments, the cache memory hierarchy of each processor core 220 includes a respective store-through level one (L1) cache 222 within and private to processor core 220, a store-in level two (L2) cache 230 private to processor core 220, and a possibly shared level three (L3) victim cache 240 that can buffer L2 castouts.

As shown, processor unit 112 is coupled to interconnect 116 via a bus interface (BI) 250. For example, processor unit 112 can communicate information with other processor units 112 and system memories 114 via BI 250 and interconnect 116. In one instance, the information can include a command requesting data. In another instance, the information can include a coherence response associated with such a request. In another instance, the information can include data associated with such a request. As illustrated, interconnect 116 can include a FBC 117.

As shown, processor unit 112 can further include snoop logic 260, response logic 262, and forwarding logic 264. Snoop logic 260, which can be coupled to or form a portion of L2 cache 230 and L3 cache 240, can be responsible for determining the individual coherence responses and actions to be performed in response to requests snooped on interconnect 116. Response logic 262 can be responsible for determining a combined response for a request issued on interconnect 116 based on individual coherence responses received from recipients of the request. Additionally, forwarding logic 264 can selectively forward communications between its local interconnect 116 and a system interconnect (e.g., interconnect 120 of FIG. 1.

Figure 3:
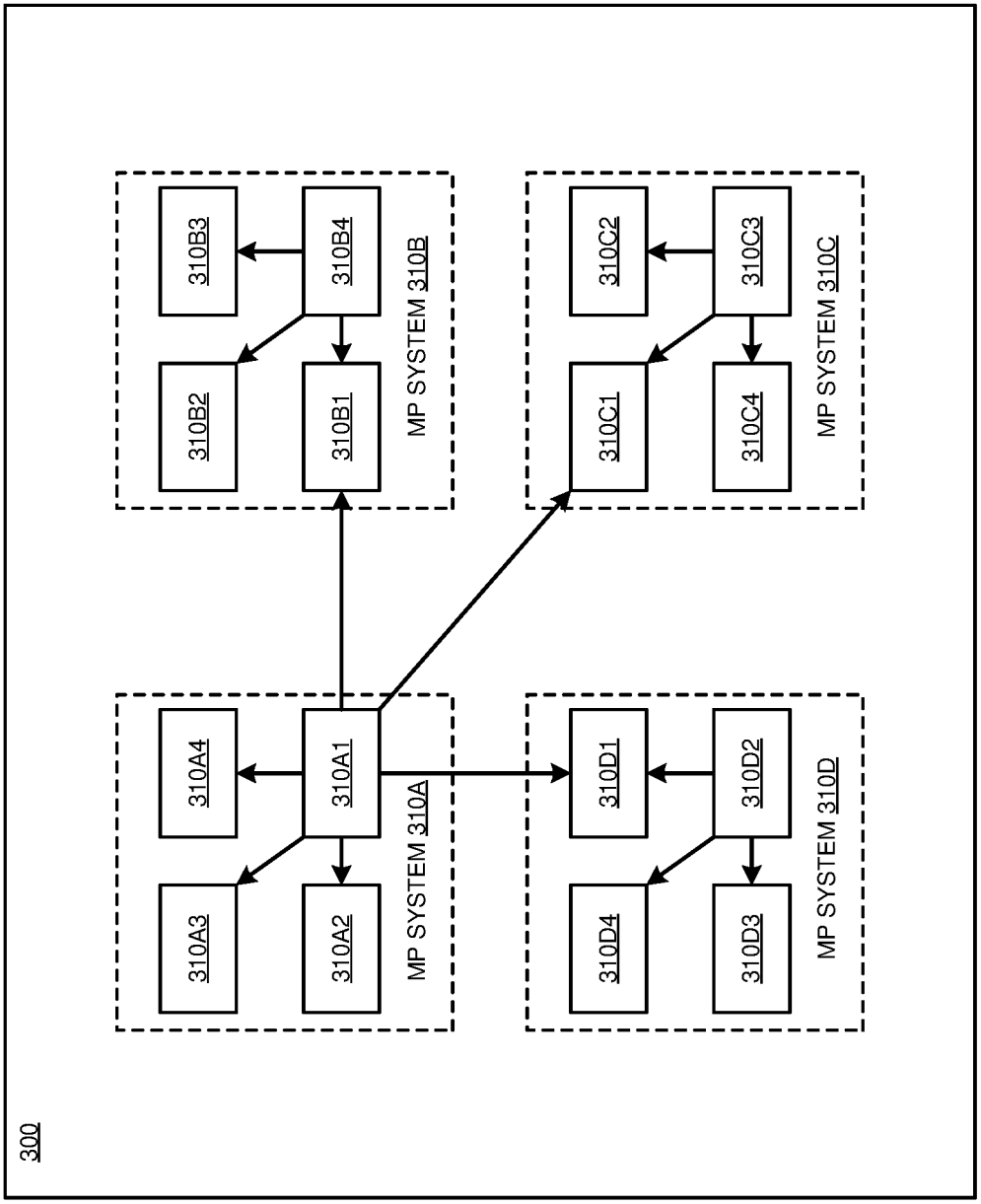
FIG. 3 depicts a block diagram of command and response data flows in a data processing system in accordance with an illustrative embodiment.

Referring now to FIG. 3, this figure depicts a block diagram of command and response data flows in a data processing system 300 in accordance with an illustrative embodiment. FIG. 3 illustrates command and response flows for a SystemScope reaching all processing units of data processing system 300. As illustrated in FIG. 3, data processing system 300 can include multiple multiprocessing (MP) systems 310A-310D. MP system 310A in turn includes processing nodes 310A1-310A4, MP system 310B includes processing nodes 310B1-310B4, MP system 310C includes processing nodes 310C1-310C4, and MP system 310D includes processing nodes 310D1-310D4. In one or more embodiments, each of MP systems 310A-310D can include one or more data processing systems 100 as shown in FIG. 1.

In one or more embodiments, cache coherency can be maintained and/or achieved in data processing system 300 by reflecting command packets to all processor units in a MP system and/or a group of MP systems. Each processor unit that receives reflected commands (e.g., command messages) can send partial responses (e.g., partial response messages) that can include information associated with a state of a snooper, a processor unit of the snooper, and/or a cache line (if any and if specified by a transfer type) held within the processor unit of the snooper. In one or more embodiments, an order in which partial response messages are sent can match an order in which reflected commands are received.

As shown in FIG. 3, processing node 310A1 can broadcast a command (request) to processing nodes 310B1, 310C1, 310D1 and 310A2-310A4. In one or more embodiments, processing nodes 310A1, 310B1, 310C1, and 310D1 can be or serve as master processing nodes of respective MP systems 310A-310D for one or more commands In one or more embodiments, processing nodes 310B1, 310C1, and 310D1 can be hub nodes and/or remote nodes, and processing nodes 310B2-310B4, 310C2-310C4, and 310D2-310D4 can be leaf nodes. In one or more embodiments, processing nodes 310A2-310A4 can be near nodes.

In another embodiment, serving as master processing nodes for the command, processing node 310B1 can broadcast the command to the processing nodes 310B2-310B4 in its MP system 310B, processing node 310C1 can broadcast the command to the processing nodes 310C2-310C4 in its MP system 310C, and processing node 310D1 can broadcast the command to the processing nodes 310D2-310D4 in its MP system 310D.

In one or more embodiments, processing nodes 310A2-310A4, 310B1-310B4, 310C1-310C4, and 310D1-310D4 can determine their respective individual coherence responses to the broadcasted command In another embodiment, processing nodes 310A2-310A4 can provide their respective responses to master processing node 310A1, processing nodes 310B2-310B4 can provide their respective responses to master processing node 310B1, processing nodes 310C2-310C4 can provide their respective responses to master processing node 310C1, and processing nodes 310D2-310D4 can provide their respective responses to master processing node 310D1. Because these coherence responses represent a response from only a subset of the scope that received the command, the coherence responses from processing nodes 310A2-310A4, 310B2-310B4, 310C2-310C4, and 310D2-310D4 can be referred to as partial responses, according to one or more embodiments.

In one or more embodiments, processing nodes 310B1, 310C1, and 310D1 can combine received partial responses into respective accumulated partial responses. In another embodiment, each of processing nodes 310B1, 310C1, and 310D1 can provide its accumulated partial response to processing node 310A1. After processing node 310A1 receives the accumulated partial responses, processing node 310A1 can combine the accumulated partial responses into a combined response.

In one or more embodiments, an interconnect bus can be over-utilized (e.g., as discussed below with reference to FIG. 4), some commands can be dropped, and a partial response (e.g., a response of a reflected command that indicates a drop: "rty_dropped_rcmd") can be returned for that processing node or a group of processing nodes. In one example, if a master processing node has exceeded a programmable threshold of retries then a mechanism and/or system can back-off command rates to allow one or more master processing nodes to make forward progress. In another example, when a first processing node has insufficient bandwidth to broadcast a command that the first processing node has received from a second processing node, the first processing node can return a retry partial response (e.g., a "rty_dropped_rcmd"). This response can indicate that the command was not broadcast to the first processing node or a group of processing nodes.

In one or more embodiments, a partial response can be combined with partial responses of other processing nodes, and the presence of a rty_dropped_rcmd may not necessarily cause a command to fail. For example, the command can still succeed even though it is not broadcast on all processing nodes in a system. For instance, as long as all required participating parties (e.g., HPC (highest point of coherency) and/or LPC (lowest point of coherency), etc.) are able to snoop and provide a non-retry partial response to a command, the operation can succeed.

For a typical request in the data processing system embodiment of FIGS. 1-2, the LPC will be the memory controller for the system memory 114 holding the referenced memory block.

In an example, an L3 cache 240 of a processor unit 112 of processing node 310C can store first data, and a processor unit 112 of processing node 310A can request the first data via a broadcast command (which may have, for example, a System or Group scope of broadcast). If the L3 cache 240 is a highest point of coherency for the first data, L3 cache 240 can respond to the command of processing node 310A with a partial response indicating that it will provide the first data to the processor unit 112 of processing node 310A. Either prior to or in response to the combined response, processing node 310C can provide the first data to processing node 310A via an interconnect 330 that couples MP system 310A-310D as illustrated in FIG. 3E, according to one or more embodiments.

Similarly, in a second example, an L2 cache 230 of processor unit 112D3 (illustrated in FIG. 1) can store second data, and processor unit 112D4 can broadcast a request for the second data (where the request can be limited in scope to only processing node 110D (i.e., a NodeScope)). If processor unit 112D3 is the HPC or is designated by the HPC to do so, processor unit 112D3 can intervene the second data to processor unit 112D4, so that processor unit 112D4 has the benefit of a lower access latency (i.e., does not have to await for delivery of the second data from the LPC (i.e., system memory)). In this case, processor unit 112D4 broadcasts a command specifying the system memory address of the second data. In response to snooping the broadcast, processor unit 112D4 provides a partial response (e.g., to processor unit 112D3) that indicates that processor unit 112D4 can provide the second data. Thereafter, prior to or in response to the combined response, processor unit 112D4 provides the second data to processor unit 112D3 via L2 cache 230 and interconnect 116D.

In one or more embodiments, the participant that issued a command that triggered a retry combined response can (or in some implementations can be required to) reissue the same command in response to the retry combined response. In one or more embodiments, drop priorities can be utilized. For example, a drop priority can be specified as low, medium, or high. In one instance, commands associated with a low drop priority can be the first commands to be dropped or overcommitted, utilizing an overcommit protocol as described with reference to FIG. 5, described below. In another instance, commands associated with a high drop priority can be the last commands to be dropped or overcommitted. In some embodiments, commands issued speculatively, such as data prefetch commands, can be associated with low drop priorities.

Figure 4:
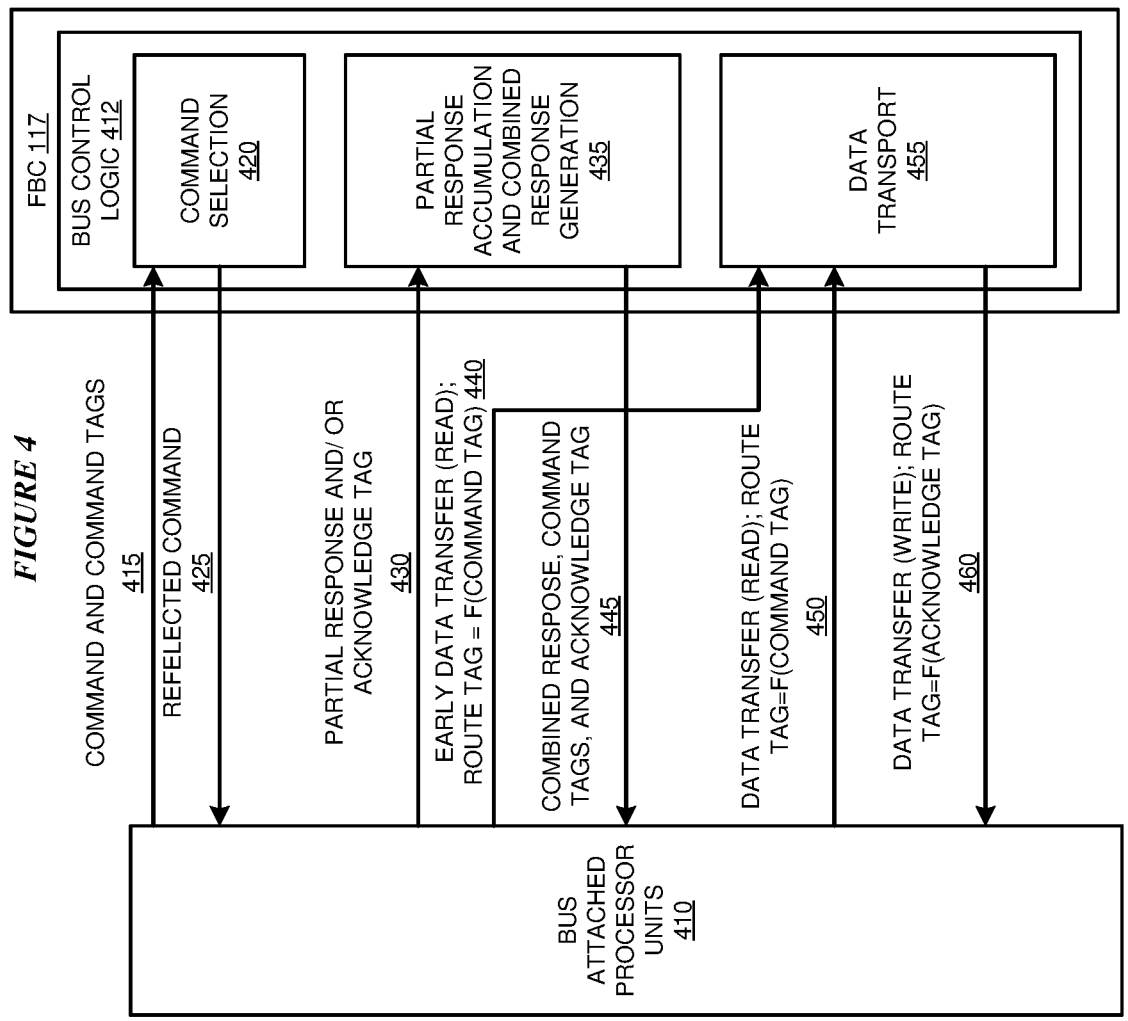
FIG. 4 depicts an exemplary timing diagram that illustrates a command, a coherence response, and data delivery sequence according to one or more embodiments.

Referring now to FIG. 4, this figure depicts an exemplary timing diagram that illustrates a command, a coherence response, and data delivery sequence according to one or more embodiments. As shown, bus attached processor units 410 can provide a command and command tags 415 to a command selection 420 of a bus control logic 412. For example, bus attached processor units 410 can be included in a transaction in a data processing system employing a snooped-based coherence protocol.

In one or more embodiments, a participant (e.g., a processor unit 112) coupled to an interconnect (e.g., a "master" of the transaction) can place a command 415 on a command interface of the interconnect. In one or more embodiments, a command 415 can specify a transaction type (tType), an identification of a requestor provided in a Transfer Tag (tTag), and optionally a target real address of a memory block to be accessed by the command.

Exemplary transaction types can include those set forth below in Table 1, for instance.

TABLE 1

| Type | Description |
|---|---|
| READ | Requests a copy of the image of a memory block for query purposes |
| RWITM (Read-With-Intent-To-Modify) | Requests a copy of the image of a memory block with the intent to update (modify) it and requires destruction of other copies, if any |
| DCLAIM (Data Claim) | Requests authority to promote an existing query- only copy of memory block to a unique copy with the intent to update (modify) it and requires destruction of other copies, if any |
| DCBZ (Data Cache Block Zero) | Requests authority to create a new unique cached copy of a memory block without regard to its present state and subsequently modify its contents; requires destruction of other copies, if any |
| CASTOUT | Copies the image of a memory block from a higher level of memory to a lower level of memory in preparation for the destruction of the higher level copy. A cast-in is a castout received from a higher level of cache memory. |
| WRITE | Requests authority to create a new unique copy of a memory block without regard to its present state and immediately copy the image of the memory block from a higher level memory to a lower level memory in preparation for the destruction of the higher level copy |
| PARTIAL WRITE | Requests authority to create a new unique copy of a partial memory block without regard to its present state and immediately copy the image of the partial memory block from a higher level memory to a lower level memory in preparation for the destruction of the higher level copy |

In one or more embodiments, bus control logic 412 can select a command from among possibly numerous commands presented by masters of a processing node and reflected commands received from other processing nodes as a next command to be issued. As shown, the command selected by command selection 420 (e.g., the control logic) is transmitted to other participants via the interconnect as a reflected command 425 after optional queuing.

In one or more embodiments, after an amount of time (e.g., tsnoop) following issuance of the reflected command, participants (e.g., snoopers) on the processing node can provide one or more of a partial response and/or an acknowledge tag 430. For example, an acknowledge tag is provided for write operations to indicate a location of the LPC (e.g., system memory 114). In one or more embodiments, bus control logic 412 can combine partial responses from processing nodes within an original broadcast scope of the command and can generate a combined response.

In one or more embodiments, for read operations, a participant that holds a copy of the target memory block in one of its caches can determine prior to receipt of a combined response of the command that it is a source of the target memory block. Consequently, this participant can transmit a copy of the target memory block toward the requestor prior to bus control logic 412 issuing a combined response for the command Such an early data transfer is illustrated in FIG. 4 at reference numeral 440.

In one or more embodiments, a partial response accumulation and combined response generation 435 can specify that data routing is based on destination addressing, and an address included in the route tag specifies a destination of a participant that is to receive the data transfer. For example, the route tag can be derived from and/or based on a tTag. For instance, the route tag can include a processing node identification and/or a processor unit identification. In one or more embodiments, an order in which read data is returned to the master may not be in a command order. For example, a processor unit can be responsible for associating a data transfer with a command, since a route tag can be the same as an original command tag.

In one or more embodiments, the combined response, the original command tag, and the acknowledge tag can be sent to one or more snoopers of the processing node and queued for transmission to other processing nodes of the system, as shown at reference numeral 445. In one example, a combined response indicates a success or a failure of a transaction. The combined response may further indicate a coherence state transition for the target cache line at the master and/or other participants, as well as any subsequent action the master and/or other participants are to perform. For example, the snooping processor unit(s) that hold a copy of the target cache line and that were not able to determine if they are to provide the data based solely on the command and the coherence state of their copy of the target cache line, can examine the combined response to determine if they are designated by the HPC to provide the target cache line to the requestor by intervention.

FIG. 4 further illustrates a participant transmitting the target cache line requested by a read command at reference numeral 450. For example, a route tag, utilized by the participant transmitting the target cache line, can be derived from and/or based on the original command tTag. In one or more embodiments, an order in which the target cache line is returned to the master may not be in command order. The use of route tags derived from or including the original command tTag thus allows the requestor to match data delivered out-of-order with commands, for instance.

As illustrated, data transport 455 transfers write data 460 for a write command. For example, the route tag included in the data delivery of the write command can be derived from and/or based on an acknowledge tag that was provided by a participant that is to perform the write operation (e.g., a memory controller). In one or more embodiments, the order in which the target cache line of write data is provided to the participant may not be in command order. As above, the use of a route tag that includes or is based upon the acknowledge tag permits the participant to pair the delivered data with the write command, for example.

In one or more embodiments, systems, methods, and/or processes described herein can utilize an overcommit protocol that allows unused coherency bandwidth to be used by higher bandwidth masters. For example, systems, methods, and/or processes described herein can use under-utilized coherency bandwidth on a fabric interconnect and can allow a coherency master to transmit at a higher rate than one specified for a fixed time-division multiplexing system.

Figure 5:
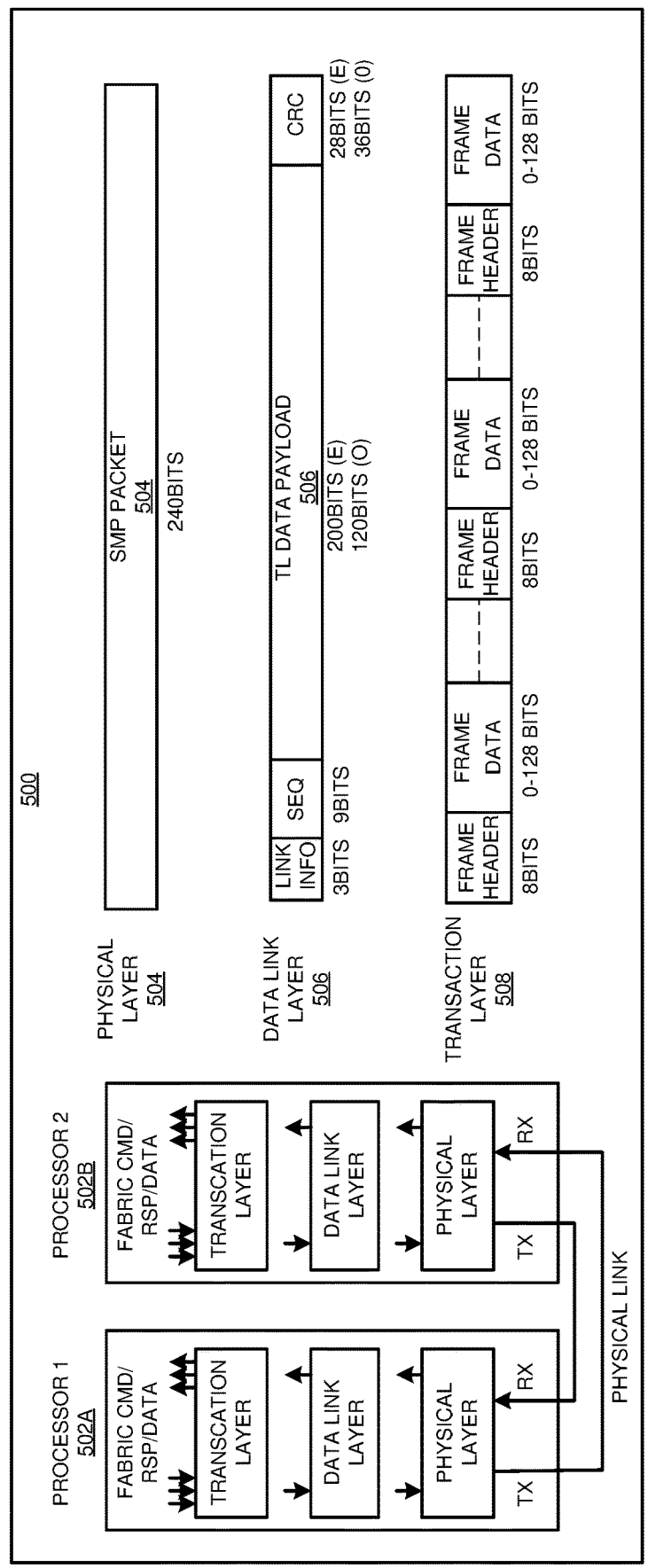
FIG. 5 depicts an external symmetric multiprocessing (SMP) interconnect protocol stack in accordance with an illustrative embodiment.

Referring now to FIG. 5, this figure depicts an external SMP interconnect protocol stack 500 in accordance with an illustrative embodiment. FIG. 5 illustrates a first processor 502A in communication with a second processor 502B via one or more physical links such as a 16G link or a 25G link. In particular embodiments, 16G refers to a bit rate of 16 Gbps and 25G refers to a bit rate of 25.78 Gbps. Each of first processor 502A and second processor 502B includes an external SMP interconnect protocol stack 500. In one or more embodiments, each external SMP interconnect protocol stack 500 includes a physical layer 504, a data link layer 506, and a transaction layer 508. In one or more embodiments, first processor 502A and second processor 502B exchange fabric commands, responses, and data using their respective external SMP interconnect protocol stacks 500.

In the illustrated embodiment, physical layer 504 includes an SMP packet filed of 240 bits. In the embodiment, data link layer 506 includes a 3 bit link information field having an acknowledgement bit, a logical link number bit, and a replay bit indicative of whether the packet contains delayed data due to replay. Data link layer 506 further includes a 9-bit sequence number field, a data payload field, and a cyclic redundancy check (CRC) field. In the particular embodiment, the data payload field has a length of 200 bits for a 16G link and 192 bits for a 25G link. Further, in the particular embodiment, the CRC field has a length of 28 bits for a 16G link and 36 bits for an 25G link.

Table 2 illustrates an example link layer packet format in accordance with an embodiment.

TABLE 2

Link Layer Packet Format

| Bits (16 G) | Bits (25 G) | Name | Meaning |
| --- | --- | --- | --- |
| 0 | 0 | ACK | 1 when a packet is ACKed |
| 1 | 1 | LINK | Logical link number |
| 2 | 2 | REPLAY | 1 when this packet contains delayed data due to replay. In an extended replay buffer size mode, this becomes a sequence number bit |
| 3:11 | 3:11 | SEQ | Sequence number. When these bits are 0X1FF the packet is a service packet. The 9-bit sequence number supports 255 packets in replay buffer. |
| 12:211 | 12:203 | Data | Data payload (25 bytes 16 G, 24 bytes 25 G). First byte used as a packet type for service packets: 0x00 - null packet 0x55 - TOD packet 0xB0 - Eatency Measure packet 0xFD - T1 packet 0xF1 - T2 packet 0xF2 - T3 packet 0xFA - T-start packet 0xFF - T-complete packet |

TABLE 2-continued

Link Layer Packet Format

| Bits (16 G) | Bits (25 G) | Name | Meaning |
| --- | --- | --- | --- |
| 212:239 | 204:239 | CRC | 28-bit (16 G) or 36-bit (25 G) CRC at end of packet |

The example link layer packet format includes an acknowledgement bit "ACK", a link bit "LINK" indicative of a logical link number, a replay bit "REPLAY", a 9-bit sequence number field "SEQ", a data payload filed "Data", and a CRC field "CRC". In the example, the "ACK" bit is set to 1 when the packet is acknowledged. The "REPLAY" bit is set to 1 when the packet contains delayed data due to replay. In a particular embodiment, an extended replay buffer size mode, the "REPLAY" portion includes a sequence number bit. The "SEQ" field indicates a sequence number. In particular embodiments, the "SEQ" field is set to 0X1FF the packet is a service packet. In the example, the 9-bit sequence number field supports 255 packets in replay buffer.

The "Data" field includes an indication of a particular command included within the link layer packet format in which the first byte is used as a packet type for the packet. Examples of packet types for the link layer packet include a null packet, a TOD packet, a latency measure packet, a T1 packet, a T2 packet, a T3 packet, a T-start packet, and a T-complete packet. In the particular example, the "Data" filed has a length of 25 bytes for a 16G link and 24 bytes for a 25G link. The "CRC" field includes a CRC value computed for the packet on a transmitting node and decoded on a receiving node appended to the end of the packet. In the particular example, the "CRC" field has a length of 28 bits for a 16G link and 36 bits for a 25G link.

Table 3 illustrates an example scope definition for processing units in accordance with an embodiment.

TABLE 3

Scope Definition For Units

| Scope | | | Definition |
| --- | --- | --- | --- |
| 000 | Ln | Local Node Scope | Local Chip |
| 010 | Nn | Near Node Scope | Local Chip + Targeted Near Chip |
| 011 | G | Group Scope | Local Chip + all Near Chips |
| 100 | Rn | Remote Node Scope | Local Chip + Targeted Remote Chip |
| 101 | Vg | Vectored Group Scope | Local Group + 1 or more Remote Groups |

Table 4 illustrates an example scope definition for an external SMP interconnect in accordance with an embodiment.

TABLE 4

Scope Definition for External SMP Interconnect

| Scope | | | Definition |
| --- | --- | --- | --- |
| 000 | Nn | Near Node Scope - drop | Drop command at command FIFO (Link Layer packet REPLAY bit set) |
| 001 | G | Group Scope - drop | Drop command at command FIFO (Link Layer packet REPLAY bit set) |

TABLE 4-continued

Scope Definition for External SMP Interconnect

| Scope | | | Definition |
|---|---|---|---|
| 010 | Nn | Near Node Scope | Local Chip + Targeted Near Chip |
| 011 | G | Group Scope | Local Chip + all Near Chips |
| 100 | Rn | Remote Node Scope | Local Chip + Targeted Remote Chip |
| 101 | Vg | Vectored Group Scope | Local Group + 1 or more Remote Groups |
| 110 | Rn | Remote Node Scope - drop | Drop command at command FIFO (Link Layer packet REPLAY bit set) |
| 111 | Vg | Vectored Group Scope - drop | Drop command at command FIFO (Link Layer packet REPLAY bit set) |

In an embodiment, the data link layer forms a 240 bit packet protected by the CRC generated on the transmit side and checked on the receive side. In the embodiment, the data link layer marks any replays on a packet by setting a REPLAY bit in the packet formatted as indicated in Table 2. In the embodiment, the transaction layer uses the REPLAY indication to mark the request (e.g., the reflected command) as dropped in an external SMP interconnect scope encoding as indicated in Table 4.

In the embodiment, the transaction layer forwards the request without the dropped indication. Requests from remote chips enter a link deskew buffer of the fabric controller and the fabric controller immediately drops requests with the dropped indication. In the embodiment, the fabric controller may drop requests in the link deskew buffer without the dropped indication either due to capacity (e.g., all entries are full) or due to expiration of the request. In an embodiment, the fabric controller includes an expiration counter used to measure how long a command has been pending and to bound the maximum latency of commands in queue.

When a command is dropped from the link deskew buffer, the fabric controller provides an indication to a response transport logic, and the response transport tags a rty_dropped_rcmd response for the particular command in an overcommit queue. As partial responses are collected by the response transport logic, the rty_dropped_rcmd is factored into the final combined response. Success of the operation is possible in the presence of the rty_dropped_rcmd response if a HPC and/or LPC is found, i.e., broadcast on the chip(s) containing the HPC/LPC.

Figure 6:
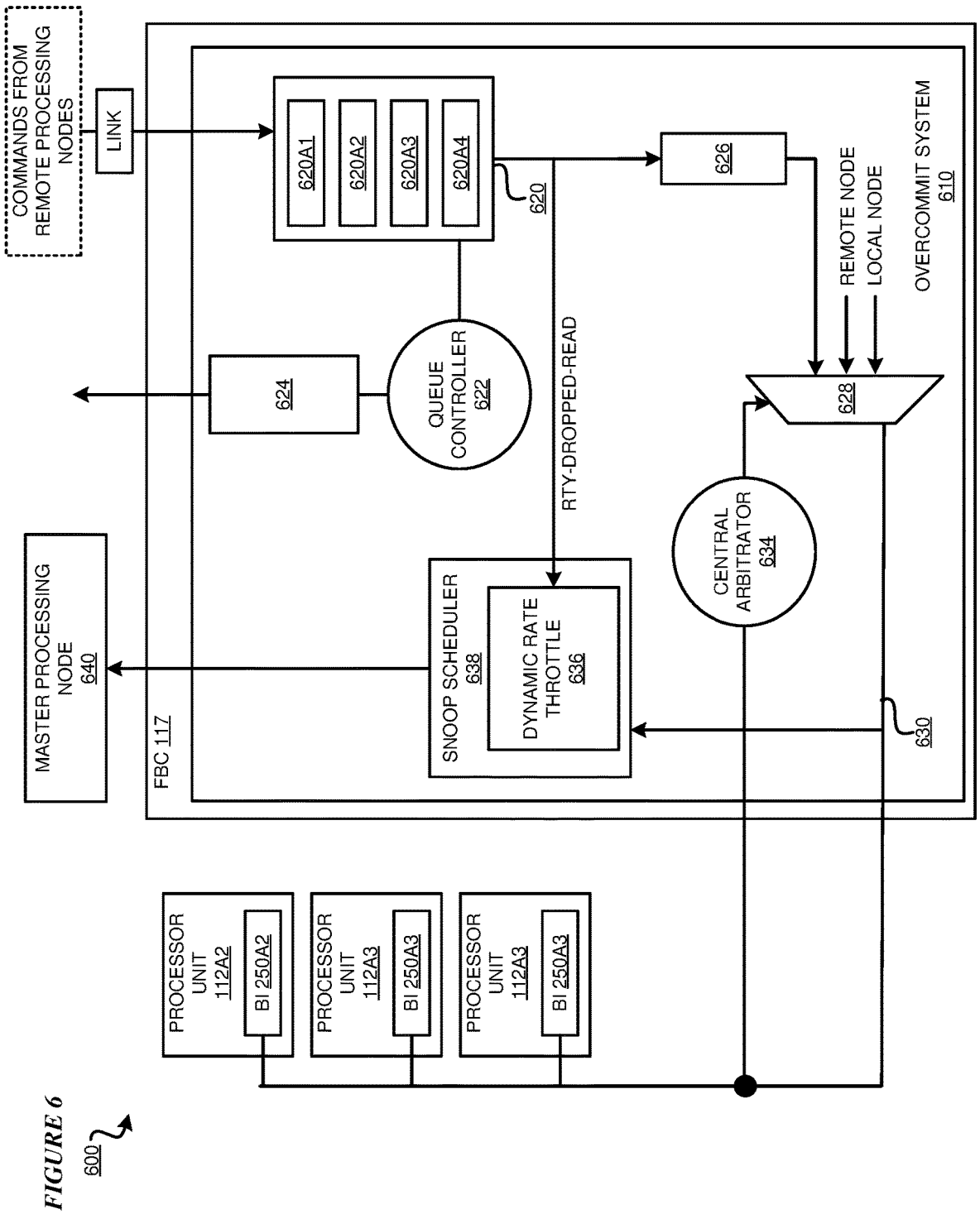
FIG. 6 depicts an exemplary block diagram of a overcommit system in accordance with an illustrative embodiment.

Referring now to FIG. 6, this figure depicts an exemplary block diagram of a overcommit system 610 in accordance with an illustrative embodiment. In one or more embodiments, overcommit system 610 can be or include an overcommit system of fabric control logic of an interconnect (e.g., FBC 117A of interconnect 116A), and commands from processing nodes can be or include commands from one or more of processing nodes 110A-110D and processing nodes 310A1-310D4, among others.

As illustrated, overcommit system 610 includes a link deskew buffer 620 and an overcommit queue 624 that are managed by a queue controller 622. As indicated, link deskew buffer 620 can receive commands from a remote processing node. In one example, processing node 310B1 can be a remote processing node of processing node 310A1, as illustrated in FIG. 3.

In one or more embodiments, link deskew buffer 620 can include a priority queue including entries 620A1-620A4, each of which can be associated with either a high priority or a low priority. In one instance, if processing node 310A1 receives a command from processing node 310B1 that is associated with a low priority and the priority queue is full (i.e., none of entries 620A1-620A4 is available for allocation and/or storage), the command from processing node 310B1 that is associated with the low priority can be dropped, and queue controller 622 can return a retry partial response (e.g., a "rty_dropped_rcmd") via overcommit queue 624. In another instance, if link deskew buffer 620 receives a first command from processing node 310B1 that is associated with a high priority, the priority queue is full, and the priority queue stores at least a second command associated with a low priority, queue controller 622 can drop the low priority second command from the priority queue of deskew buffer 620 to permit the first command to be stored.

In one or more embodiments, commands stored by entries 620A1-620A4 of link deskew buffer 620 can be associated with one or more expirations. For example, commands stored via entries 620A1-620A4 can expire after an amount of time transpires after the commands are placed in deskew buffer 620. For instance, a command stored in entry 620A1 can be discarded and/or overwritten after an amount of time transpires after the command is placed in entry 620A1. In one or more embodiments, overcommitting a command from a near processing node can include displacing and/or overwriting data of an entry (e.g., a command stored by one of entries 620A1-620A4) after an expiration of the data stored in the entry 620.

In one or more embodiments, overcommit queue 624 stores statuses of commands from link deskew buffer 620 and/or from near processing nodes. For example, overcommit queue 624 can preserve an ordering of responses corresponding to commands received from near processing nodes.

As shown, link deskew buffer 620 can be further coupled to a commit queue 626. In one or more embodiments, data stored in commit queue 626 can expire after an amount of time transpires after the data is stored. If a command stored in commit queue 626 expires, the command can be changed to a no-operation (NOP) command Changing the command into a NOP command can preserve an ordering of responses corresponding to commands from near processing nodes. For instance, the NOP command can be or include an overcommit NOP command.

As illustrated, commit queue 626 can be coupled to a multiplexer 628, and multiplexer 628 can be coupled to a snoop bus 630, which is in turn coupled to bus interfaces 632A-632H of processor units of near processing nodes. As shown, multiplexer 628 can be further coupled to a central arbitrator 634 that controls multiplexer 628. As illustrated, link deskew buffer 620 can be coupled to a dynamic rate throttle 636 that can be included in a snoop scheduler 638.

In one or more embodiments, dynamic rate throttle 636 monitors responses of commands. For example, dynamic rate throttle 636 can monitor a rate of "retry dropped" responses (e.g., response of "rty_dropped_rcmd"). Dynamic rate throttle 636 can then adjust a command rate if a rate of "retry dropped" responses is too high. As shown, snoop scheduler 638 can be coupled to a master processing node 640.

In one or more embodiments, snoop scheduler 638 provides feedback information to master processing node 640 that can be utilized to control overcommit commands In one example, if a rate of "retry dropped" responses is too high (e.g., at or above a threshold), snoop scheduler 638 can provide information to master processing node 640 that indicates that an overcommit command rate should be lowered. In another example, if a rate of "retry dropped" responses is at or below a level, snoop scheduler 638 can provide information to master processing node 640 that indicates that an overcommit command rate can be increased. For instance, snoop scheduler 638 can provide information that indicates that a higher overcommit command issue rate can be accommodated.

Figure 7:
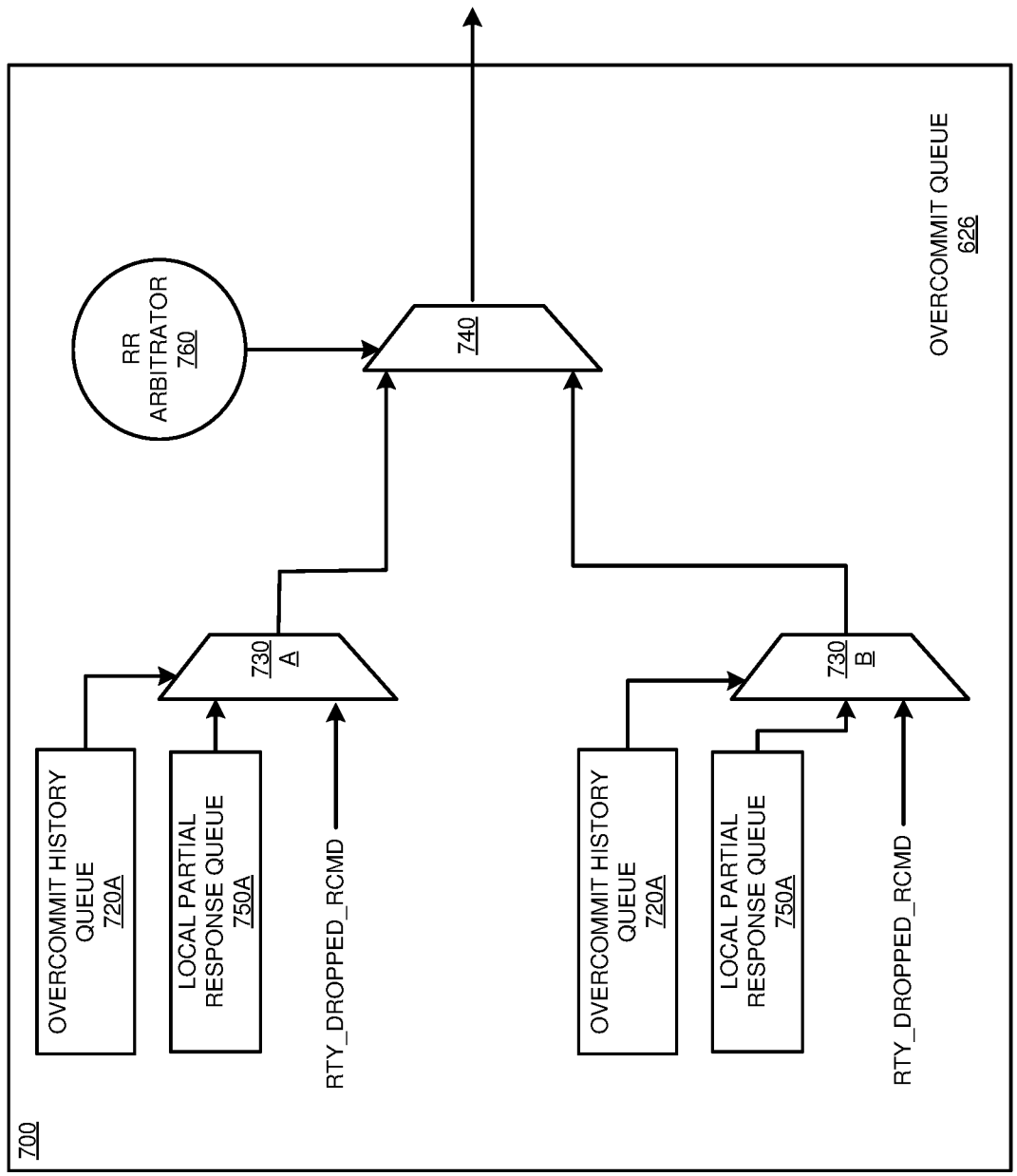
FIG. 7 depicts an exemplary block diagram of an overcommit queue in accordance with an illustrative embodiment.

Referring now to FIG. 7, this figure depicts an exemplary block diagram of overcommit queue 626 of FIG. 6 in accordance with an illustrative embodiment. As shown, overcommit queue 626 can include an overcommit history queue 720A and a local partial response queue 750A both coupled to a multiplexer 730A, which is in turn coupled to an output multiplexer 740. In one or more embodiments, overcommit history queue 720A can control multiplexer 730A in choosing between data from local partial response queue 750A and a "retry dropped" partial response (e.g., rty_dropped_rcmd).

As shown, overcommit queue 626 can further include an overcommit history queue 720B and a local partial response queue 750B both coupled to a multiplexer 730B, which is in turn coupled to output multiplexer 740. In one or more embodiments, overcommit history queue 720B can control multiplexer 730B in choosing between data from local partial response queue 750B and a "retry dropped" partial response (e.g., Rty_dropped_rcmd).

In one or more embodiments, overcommit history queue 720A, local partial response queue 750A, and multiplexer 730A can be utilized for even command addresses, and overcommit history queue 720B, local partial response queue 750B, and multiplexer 730B can be utilized for odd command addresses. A round robin (RR) arbitrator 760 can be utilized to select one of the outputs of multiplexers 730A and 730B as the output of output multiplexer 740.

Figure 8:
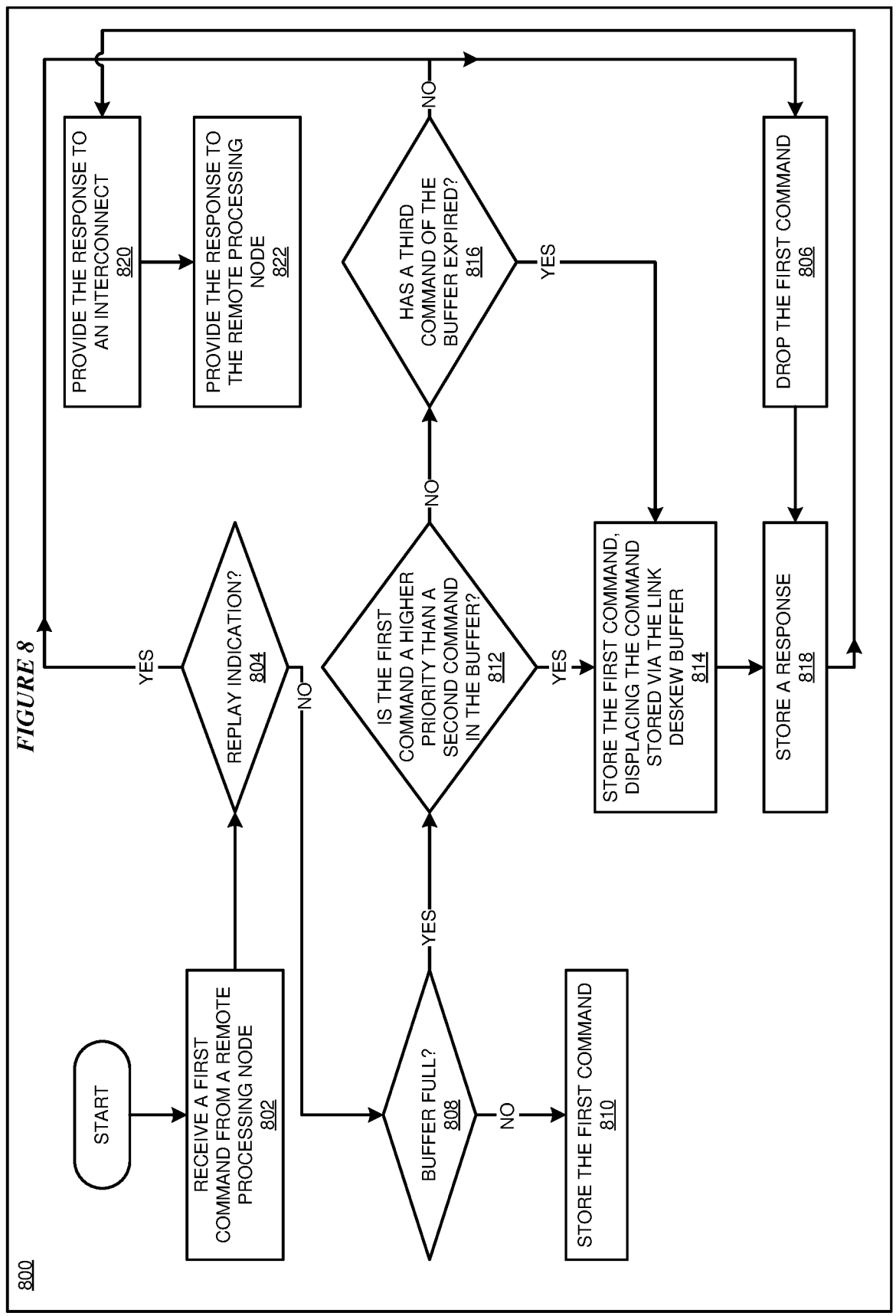
FIG. 8 depicts a flowchart of an example process for link-level CRC replay in a multiprocessor data processing system in accordance with an illustrative embodiment.

With reference to FIG. 8, this figure depicts a flowchart of an example process 800 for link-level CRC replay in a multiprocessor data processing system in accordance with an illustrative embodiment. In one or more embodiments, an overcommit system of a fabric controller, such as overcommit system 610 of FIG. 6, performs one or more functions of process 800. In block 802, the fabric controller receives a command from a remote processing node via a link. In one example, processing node 310A1 (illustrated in FIG. 3) can include an overcommit system such as overcommit system 610, and overcommit system 610 can receive the command from processing node 310B1.

In block 804, link deskew buffer 620 determines whether the command includes a replay indication indicative that the command contains delayed data due to a replay event at one or more processing nodes. In one or more embodiments, the replay indication is formatted in accordance with the link layer packet format as described herein. In a particular embodiment, the remote processing node forms a packet in a link layer in which a field of the packet includes the replay indication indicated by setting a replay bit in the packet as described herein with respect to one or more embodiments. In an embodiment, the replay indication is used by a transaction layer to mark the command as dropped in an external scope encoding. If link deskew buffer 620 determines that the first command includes a replay indication, the process continues to block 806. In block 806, the first command is dropped by link deskew buffer 620. If link deskew buffer 620 determines that the first command does not includes a replay indication, the process continues to block 808.

In block 808, queue controller 622 determines if link deskew buffer 620 is full (e.g., at capacity). If link deskew buffer 620 is not full, the first command is stored in link deskew buffer 620 in block 810. If link deskew buffer 620 is full in block 808, queue controller 622 determines in block 812 whether or not the first command has a higher priority than a second command stored in link deskew buffer 620. If the first command has a higher priority than the second command, queue controller 622 causes the first command to be enqueued in link deskew buffer 620, displacing the second command in block 814. The first command is said to be "overcommitted" when it displaces the second command, according to one or more embodiments.

In response to a determination in block 812 that the first command does not have a higher priority than the second command, queue controller 622 determines in block 816 if a third command stored in link deskew buffer 620 has expired. In response to a determination in block 816 that the third command has expired, queue controller 622 causes the first command to be enqueued in link deskew buffer 620, displacing the third command (block 814). The first command is said to be "overcommitted" when it displaces the third command, according to one or more embodiments. In response to a determination at block 806 that the third command has not expired, the first command is dropped at block 806. In one or more embodiments, the third command can be the second command.

In one or more embodiments, if a command is displaced or dropped, a corresponding partial response is still stored. In one example, if the second command is displaced in block 814, queue controller 622 stores a partial response (e.g., "rty_dropped_rcmd") in overcommit queue 626, in block 818. In another example, if the first command is dropped in block 806, queue controller 622 stores a partial response (e.g., "rty_dropped_rcmd") in overcommit queue 626 in block 818.

At block 820, overcommit queue 626 provides the partial response to an interconnect. In one example, overcommit queue 626 can provide the partial response, indicating that the first command or the second command was displaced or dropped, to interconnect 120. In another example, overcommit queue 626 can provide the partial response, indicating that the first command or the second command was displaced or dropped, to interconnect 117. At block 822, interconnect 120 provides the partial response to the remote node that provided the command that was displaced or dropped.

In one or more embodiments, an interconnect can assign different command issue rates depending on a drop priority. In one example, a low drop priority can be associated with a higher issue rate. For instance, low drop priority commands can be speculative. In another example, a high drop priority can be associated with a lower issue rate. In this fashion, an interconnect can control a number of commands issued such that high drop priority commands can be most likely succeed independent of system traffic, and low priority commands can succeed as long as there is not contention with other low drop priority commands of other processing nodes.

In one or more embodiments, fabric command arbiters can assign a command issue rate based on one or more of a command scope, a drop priority, and a command rate level, among other criteria. For example, a fabric command arbiter can include a hardware control mechanism using coherency retries as feedback. For instance, a fabric command arbiter (e.g., central arbitrator 634 shown in FIG. 6) can be configured with eight issue rate levels from zero (highest) to seven (lowest).

As has been described, in one embodiment, a data processing system includes an interconnect, a plurality of processing nodes coupled to the interconnect, and a fabric controller configured to, responsive to receiving via the interconnect a plurality of messages from the plurality of processing nodes, store, via a buffer, at least a first message of the plurality of messages and a second message of the plurality of messages. The fabric controller is further configured to determine at least one of that a third message of the plurality of messages is associated with a higher priority than a priority associated the first message and that a first amount of time has transpired that exceeds a first expiration associated with the first message. The fabric controller is further configured to store, via displacing the first message from the buffer, the third message in the buffer in response to the determination and transmit the first, second and third messages to at least one processor unit.

While the present invention has been particularly shown as described with reference to one or more preferred embodiments, it will be understood by those skilled in the art that various changes in form and detail may be made therein without departing from the spirit and scope of the invention.

Thus, a computer implemented method, system or apparatus, and computer program product are provided in the illustrative embodiments for link-level cyclic redundancy check (CRC) replay for non-block coherence flow in a multiprocessor data processing system and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of data processing in a data processing system including a plurality of processing nodes coupled to an interconnect, the method comprising:
   receiving, by a fabric controller, a first command from a remote processing node via the interconnect;
   determining, by the fabric controller, that the command includes a replay indication, the replay indication indicative of a replay event at one or more processing nodes of the plurality of processing nodes;
   returning, by the fabric controller, a combined response to the remote processing node, wherein the combined response is comprised of one or more partial responses received from the plurality of processing nodes; and wherein the partial responses include an indication that the command was dropped; and
   dropping the first command from a deskew buffer of the fabric controller responsive to the determining that the command includes the replay indication.

2. The method of claim 1, further comprising:
   storing a partial response associated with the command in an overcommit queue of the fabric controller.

3. The method of claim 2, wherein the partial response includes an indication that the command was dropped.

4. The method of claim 2, further comprising:
   sending the partial response to the remote processing node via the interconnect.

5. The method of claim 1, wherein the command is formatted as a link layer packet, the replay indication being in a first field of the link layer packet.

6. The method of claim 5, wherein the first field is a one-bit field, a value of the one-bit field indicative of the replay indication.

7. The method of claim 5, wherein the link layer packet further includes a second field, the second field including a command data payload.

8. The method of claim 5, wherein the link layer packet further includes a second field including a cyclic redundancy check value associated with the link layer packet.

9. The method of claim 1, wherein the data processing system includes a symmetric multiprocessor system.

10. A computer usable program product comprising one or more computer-readable storage devices, and program instructions running on a processor and stored on at least one of the one or more storage devices, the stored program instructions comprising:
    program instructions to receive, by a fabric controller, a first command from a remote processing node via an interconnect;
    program instructions to determine, by the fabric controller, that the command includes a replay indication, the replay indication indicative of a replay event at one or more processing nodes of a plurality of processing nodes;
    program instructions to return, by the fabric controller, a combined response to the remote processing node, wherein the combined response is comprised of one or more partial responses received from the plurality of processing nodes; and wherein the partial responses include an indication that the command was dropped; and
    program instructions to drop the first command from a deskew buffer of the fabric controller responsive to the determining that the command includes the replay indication.

11. The computer usable program product of claim 10, further comprising:
    program instructions to store a partial response associated with the command in an overcommit queue of the fabric controller.

12. The computer usable program product of claim 11, wherein the partial response includes an indication that the command was dropped.

13. The computer usable program product of claim 11, further comprising:
    program instructions to send the partial response to the remote processing node via the interconnect.

14. The computer usable program product of claim 10, wherein the command is formatted as a link layer packet, the replay indication being in a first field of the link layer packet.

15. The computer usable program product of claim 14, wherein the first field is a one-bit field, a value of the one-bit field indicative of the replay indication.

16. The computer usable program product of claim 14, wherein the link layer packet further includes a second field, the second field including a command data payload.

17. The computer usable program product of claim 14, wherein the link layer packet further includes a second field including a cyclic redundancy check value associated with the link layer packet.

18. The computer usable program product of claim 13, wherein the computer usable code is stored in a computer readable storage device in a data processing system, and wherein the computer usable code is transferred over a network from a remote data processing system.

19. The computer usable program product of claim 13, wherein the computer usable code is stored in a computer readable storage device in a server data processing system, and wherein the computer usable code is downloaded over a network to a remote data processing system for use in a computer readable storage device associated with the remote data processing system.

20. A computer system comprising one or more processors, one or more computer-readable memories, and one or more computer-readable storage devices, and program instructions stored on at least one of the one or more storage devices for execution by at least one of the one or more processors via at least one of the one or more memories, the stored program instructions comprising:
  program instructions to receive, by a fabric controller, a first command from a remote processing node via an interconnect;
  program instructions to determine, by the fabric controller, that the command includes a replay indication, the replay indication indicative of a replay event at one or more processing nodes of a plurality of processing nodes;
  program instructions to return, by the fabric controller, a combined response to the remote processing node, wherein the combined response is comprised of one or more partial responses received from the plurality of processing nodes; and wherein the partial responses include an indication that the command was dropped; and
  program instructions to drop the first command from a deskew buffer of the fabric controller responsive to the determining that the command includes the replay indication.

* * * * *